United States Patent

Tsai et al.

[19]

[11] Patent Number: 6,071,790
[45] Date of Patent: Jun. 6, 2000

[54] METHOD OF CROWN CAPACITOR ROUNDING BY OXIDANT DIPPING PROCESS

[75] Inventors: Hsin-Chuan Tsai; Yinan Chen, both of Taipei, Taiwan

[73] Assignee: Nanya Technology Corporation, Iaoyuan, Taiwan

[21] Appl. No.: 09/185,629

[22] Filed: Nov. 4, 1998

[30] Foreign Application Priority Data

Sep. 4, 1998 [TW] Taiwan ................................. 87114670

[51] Int. Cl.$^7$ ......................... H01L 21/20; H01L 21/8242
[52] U.S. Cl. .......................... 438/398; 438/253; 438/255; 438/396
[58] Field of Search ..................................... 438/253, 254, 438/255, 250, 386, 243, 396, 398, 743, 756, 787, 770, 704

[56] References Cited

U.S. PATENT DOCUMENTS 5,489,557  2/1996  Jolley ........................................ 156/640
5,770,095  6/1998  Sasaki et al. ............................ 438/633

Primary Examiner—Matthew Smith
Assistant Examiner—Lex H. Malsawma
Attorney, Agent, or Firm—Bacon & Thomas

[57] ABSTRACT

A method of rounding the bottom electrode top surface of a stack crown capacitor by using chemical oxidation is disclosed. First, forming a bottom electrode of a stack crown capacitor on a semiconductor substrate. Next, oxidizing the bottom electrode top surface by using oxidant dipping. Finally, removing the oxide from the bottom electrode top surface to achieve the goal of surface planarization. Thereafter, repeating the above steps to meet the requirement of surface planarization.

17 Claims, 2 Drawing Sheets

6,071,790

METHOD OF CROWN CAPACITOR ROUNDING BY OXIDANT DIPPING PROCESS

BACKGROUND OF THE INVENTION

1. Field of the Invention

The present invention relates to a method of fabricating a stack crown capacitor of a dynamic random access memory (DRAM) cell, and more particularly to a planarization of the bottom electrode top surface of a stack crown capacitor.

2. Description of the Prior Art

A DRAM cell comprises a metal-oxide-semiconductor field effect transistor (MOSFET) and a capacitor that are built in a semiconductor silicon substrate. There is an electrical contact between the drain of a MOSFET and the storage node of the adjacent capacitor, forming a memory cell of the DRAM device. A large number of memory cells make up the cell arrays which combine with the peripheral circuit to produce DRAMs.

In recent years, the sizes of the MOSFETs and capacitors have become continuously smaller so that the packing densities of these DRAM devices have increased considerably. For example, a number of semiconductor manufacturing companies in the world have already begun mass production of 64 Mbit DRAMs. These high density DRAMs offer the advantages of longer refresh time as well as less power consumption. However, as the sizes of the capacitors become smaller, so as the capacitance values of the capacitors are decreasing, that reduces the signal to noise ratio of the DRAM circuits, causing the performance problem. The issue of maintaining or even increasing the surface area of the storage nodes or reducing the thickness of the dielectric layer is particularly important as the density of the DRAM arrays continues to increase for future generations of memory devices.

There are two ways to deal with this problem: increasing the thickness of the bottom electrodes or increasing the surface area of the capacitors. Since increasing the thickness of the bottom electrodes is very difficult for precision lithography and etching control, increasing the capacitor surface area becomes an easier approach when the capacitor is used to fabricate 16 Mbit DRAMs and beyond. Various shapes of capacitor structures have been used to address this issue. U.S. Pat. No. 5,185,282 to Lee et al. of Hyundai Electronics (the entire disclosure of which is herein incorporated by reference) provides a method of fabricating cup-shaped capacitor storage node. Another U.S. Pat. No. 5,021,357 to Taguchi et al. of Fujisu (the entire disclosure of which is herein incorporated by reference) discloses a method of fabricating fin structure capacitor electrode. U.S. Pat. No. 5,021,357 to Choi et al. of Samsung (the entire disclosure of which is herein incorporated by reference) provides a method of fabricating crown-shaped (or cylinder-shaped) capacitor structure.

Referring now to FIG. 1, there is shown a portion of partially completed Metal-Oxide-Semiconductor Field Effect Transistor (MOSFET). A dielectric layer 2 is deposited on a semiconductor substrate 1 which includes pre-formed electrical devices. Then, a contact window is opened in the dielectric layer 2 for forming a polysilicon plug 4. Next, a polysilicon bottom electrode 5 of a crown capacitor is formed by using conventional techniques of deposition, lithography and etching. There is a silicon nitride structure 3 as a bolster which can support the whole structure of the crown capacitor. Referring to FIG. 2, there is a cross-sectional view of the polysilicon surface corresponding to part A of FIG. 1, the step of etching makes the surface of the bottom electrode 5 rough. Therefore, a leakage current problem is induced by point discharge from the rough surface topology. In order to avoid this problem, the planarization of the bottom electrode 5 of the crown capacitor is usually achieved by the high-cost method of Chemical Mechanical Polishing (CMP), which increases the cost of DRAM process. Therefore, the present invention provides a new method of surface planarization for crown capacitor process to solve the above-mentioned problem.

SUMMARY OF THE INVENTION

According, it is a primary object of the present invention to provide a method of rounding the bottom electrode top surface of a stack crown capacitor by using chemical oxidation to easily solve the capacitor leakage current problem caused by point discharge from the rough surface topology.

It is another object of the present invention to provide a method of planarizing the surface of polysilicon layer by using chemical oxidation for related processes in integrated-circuit manufacture.

These objects are accomplished by the fabrication process described below.

First, forming a bottom electrode of a stack crown capacitor on a semiconductor substrate. Next, oxidizing the bottom electrode top surface by using oxidant dipping. Finally, removing the oxide from the bottom electrode top surface to achieve the goal of surface planarization. Thereafter, repeating the above steps to meet the requirement of surface planarization.

BRIEF DESCRIPTION OF THE DRAWINGS

The accompanying drawings forming a material part of this description, in which.

DETAILED DESCRIPTION OF THE PREFERRED EMBODIMENT

Figure 1:
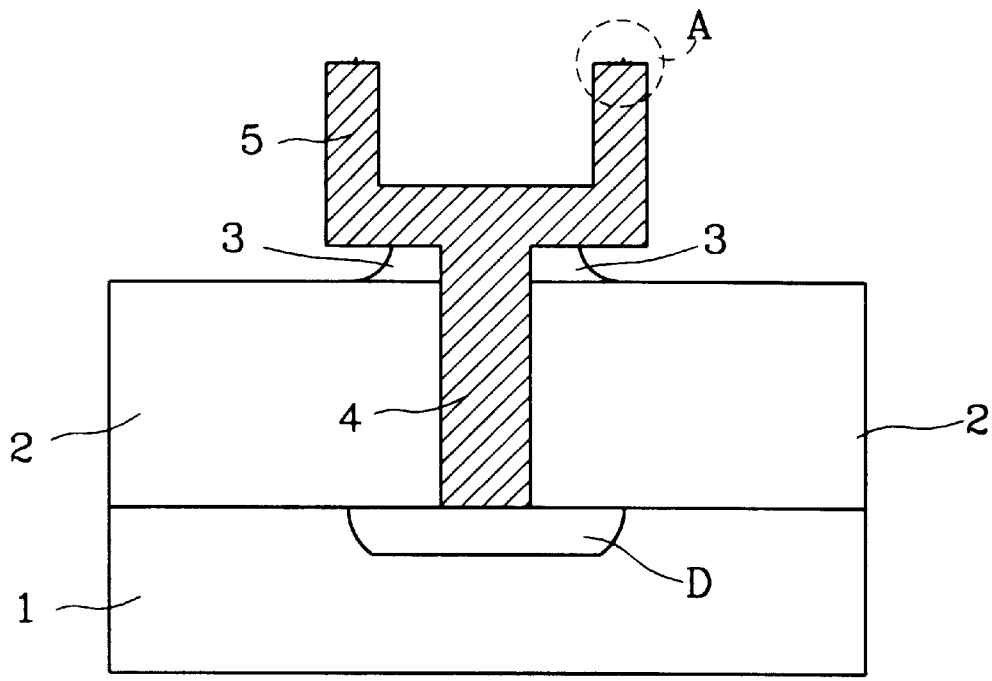
FIG. 1 is a cross-sectional view of the bottom electrode of a stack crown capacitor.
Figure 2:
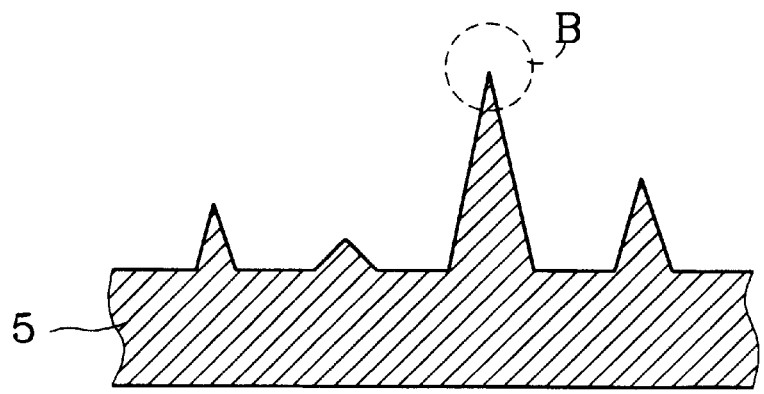
FIG. 2 is a cross-sectional view of the polysilicon surface corresponding to part A of FIG. 1 according to the prior art.

The invention disclosed herein is directed to a method of fabricating the stack crown capacitors of DRAMs. The drawing figures are illustrated a partially completed integrated circuit device. In the following description, numerous details are set forth in order to provide a thorough understanding of the present invention. It will be appreciated by ones skilled in the art that variations of these specific details are possible while still achieving the results of the present invention. In other instance, well-known processing steps are not described in detail in order not unnecessarily to obscure the present invention.

Referring now more particularly to FIG. 1, there is shown a portion of partially completed Metal-Oxide-Semiconductor Field Effect Transistor (MOSFET). A MOSFET region is usually consist of a gate oxide, gate electrode, pad oxide, lightly doped region, spacers, source and drain. For simplicity reason, FIG. 1 only shows the drain region D of a MOSFET which is fabricated on a P-type semiconductor silicon substrate 1. The drain region D of the MOSFET which is formed by ion implantation technique, is preferably doped with arsenic ($As^{75}$) or phosphorus ($P^{31}$) ions, with an implantation dose of 2E15 to 5E16 $cm^{-2}$, and an implantation energy of 30 to 80 keV.

Referring to FIG. 1 again, a dielectric layer 2 and a silicon nitride layer 3 layers are continuously deposited on the silicon substrate 1. The dielectric layer 2 is usually using boronphospho-silicate glass (BPSG) which is formed by atmosphere CVD (APCVD) technique under the following conditions: the temperature is about 400° C., and pressure is about 1.0 torr, with reactant gases of $Si(C_2H_5O)_4$, $N_2$ and TMB (Tri-Methyl-Borate). The thickness of the dielectric layer 2 is about 3000 to 8000 Angstroms. Thereafter, the dielectric layer 2 is planarized by thermal reflow or etchback. The silicon nitride layer 3 which serves as polysilicon etch stopper is usually formed by LPCVD technique under the following conditions: the pressure is between 200 to 400 mTorr, with a temperature of about 720° C. to a thickness of between 200 to 600 Angstroms.

Still Referring to FIG. 1, the dielectric 2 and silicon nitride 3 layers are partially etched to open a cell contact window for the drain D of the MOSFET by the conventional lithography and plasma-etching techniques. The plasma etching process can use magnetic enhanced reactive ion etching (MERIE), electron cyclotron etching (ECR) or reactive ion etching (RIE) methods with reactant gases such as $CF_4$, $CHF_3$ and Ar. Next, a polysilicon layer which is overlaying the silicon nitride layer 3 and filling into the cell contact window is deposited. The polysilicon layer is usually formed by in-situ phosphorus doped LPCVD method under a mixture of ($15\%PH_3+85\%SiH_4$) and ($5\%PH_3+95\%N_2$), at a temperature about 550° C. Thereafter, a polysilicon bottom electrode 5 of a crown capacitor is formed by using conventional techniques of deposition, lithography and etching. The remaining of silicon nitride structure 3 as a bolster can support the whole structure of the crown capacitor.

Figure 3:
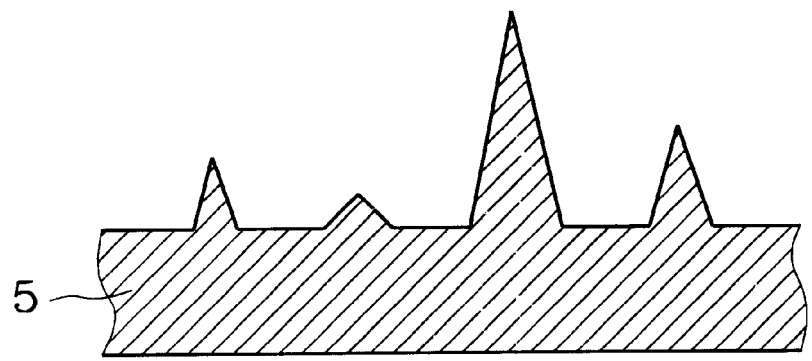
FIGS. 3 A~C show schematic cross-sectional views of the polysilicon surface corresponding to part A of FIG. 1 at successive stages in planarizing the rough surface according to an embodiment of the present invention.
Figure 3:
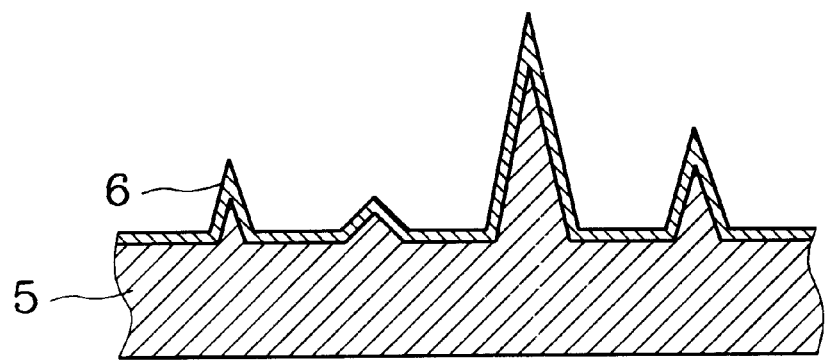
Figure 3:
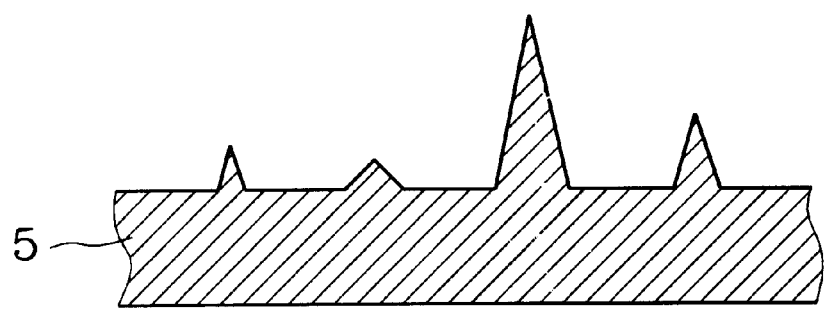

Referring now to FIG. 3A, there is a cross-sectional view of the surface of said bottom electrode 5 corresponding to part A of FIG. 1, the step of etching usually makes the surface of the bottom electrode 5 rough. Therefore, a leakage current problem is induced by point discharge from the rough surface topology. The following steps are the key of the present invention.

Referring now to FIG. 3B, the bottom electrode top surface is oxidized by dipping into oxidant solution to form a thin film of silicon oxide layer 6 on the polysilicon surface. This dipping step is using oxidants $H_2O_2$, $HNO_3$, or a mixture of $H_2O_2/HNO_3$. In the present invention, the solution of $H_2O_2/HNO_3$ is preferred, the solution of $H_2O_2/HNO_3$ includes 20~40% $H_2O_2$ and 60~80% $HNO_3$. The step of dipping is about 15~35 seconds to complete an oxidation reaction cycle. Typically, this dipping step can consume about 10 Angstroms polysilicon surface and produce about 20 Angstroms silicon oxide 6.

Next, Referring now to FIG. 3C, the thin film of silicon oxide layer 6 is removed from the bottom electrode top surface to achieve the goal of surface planarization. This step is performed by dilute hydrofluoric acid (DHF) dipping, wherein said dilute hydrofluoric acid has a concentration between 0.5~1%. The dilute hydrofluoric acid (DHF) dipping step is about 30~60 seconds to complete the silicon oxide layer 6 removing.

Thereafter, the above dipping steps can be repeated several times to meet the requirement of surface planarization. As described above, the dipping steps can remove about 10 Angstroms rough polysilicon from the surface. Generally speaking, removing 30 Angstroms polysilicon surface by repeating said steps three times can easily achieve the goal of polysilicon surface planarization.

The bottom electrode top surface rounding of a stack crown capacitor by using oxidant dipping according to the present invention can gradually planarize the rough polysilicon surface to make an easily integrated process and decrease process cost. The method disclosed according to the present invention can also be used in other processes, like gate or poly-load fabrication, for polysilicon surface planarization.

It is to be understood that although the present invention has been described with reference to a particular preferred embodiment, it should be appreciated that numerous modifications, variations and adaptations may be made without departing from the scope of the invention as defined in the claims.

What is claimed is:

1. A method of rounding the top surface of the bottom electrode of a stack crown capacitor, comprising:

(a) providing a semiconductor substrate with a preformed polysilicon bottom rough surface electrode of the stack crown capacitor;

(b) forming an oxide layer on the top surface of said polysilicon bottom electrode by a first dipping process with an oxidant; and (c) completely removing said oxide layer from the top surface of said polysilicon bottom electrode by a second dipping process with a dilute hydrofluoric acid (DHF);

whereby said top surface of the bottom electrode of the stack crown capacitor is planarized.

2. The method as recited in claim 1, wherein said steps (b) through (c) are repeated several times after said step (c) to meet the requirement of planarization of said polysilicon bottom electrode surface.

3. The method as recited in claim 1, wherein said oxidant is $H_2O_2$.

4. The method as recited in claim 1, wherein said oxidant is $HNO_3$.

5. The method as recited in claim 1, wherein said oxidant is a mixture of $H_2O_2/HNO_3$.

6. The method as recited in claim 5, wherein said solution of $H_2O_2/HNO_3$ comprises 20~40% of $H_2O_2$ and 60~80% of $HNO_3$.

7. The method as recited in claim 1, wherein said dipping in step (b) is about 15~35 seconds.

8. The method as recited in claim 1, wherein said dilute hydrofluoric acid has a concentration between 0.5~1%.

9. The method as recited in claim 1, wherein said dilute hydrofluoric acid (DHF) dipping is about 30~60 seconds.

10. A method of rounding the top surface of the bottom electrode of a stack crown capacitor, comprising:

(a) providing a semiconductor substrate with a preformed polysilicon bottom rough surface electrode of the stack crown capacitor;

(b) forming an oxide layer on the top surface of said polysilicon bottom electrode with a first dipping process, wherein said oxidant is selected from the group consisting of $H_2O_2$, $HNO_3$ and an $H_2O_2/HNO_3$ mixture;

(c) completely removing said oxide layer from the top surface of said polysilicon bottom electrode by a second dipping process with a dilute hydrofluoric acid (DHF); and (d) repeating step (b) through step (c) several times to planarize said polysilicon bottom electrode surface;

whereby said top surface of the bottom electrode of the stack crown capacitor is planarized.

11. The method as recited in claim 10, wherein said oxidant is $H_2O_2$.

12. The method as recited in claim 10, wherein said oxidant is $HNO_3$.

13. The method as recited in claim 10, wherein said oxidant is a mixture of $H_2O_2/HNO_3$.

14. The method as recited in claim 13, wherein said solution of $H_2O_2/HNO_3$ comprises 20~40% of $H_2O_2$ and 60~80% of $HNO_3$.

15. The method as recited in claim 10, wherein said dipping in step (b) is about 15~35 seconds.

16. The method as recited in claim 10, wherein said dilute hydrofluoric acid has a concentration between 0.5~1%.

17. The method as recited in claim 10, wherein said dilute hydrofluoric acid (DHF) dipping is about 30~60 seconds.

* * * * *